US008956453B2

(12) United States Patent
Lieten et al.

(10) Patent No.: US 8,956,453 B2
(45) Date of Patent: Feb. 17, 2015

(54) METHOD FOR PRODUCING A CRYSTALLINE GERMANIUM LAYER ON A SUBSTRATE

(75) Inventors: Ruben Lieten, Zonhoven (BE); Stefan Degroote, Scherpenheuven-Zichem (BE)

(73) Assignees: IMEC, Leuven (BE); Vrije Universiteit Brussel, Brussel (BE)

(*) Notice: Subject to any disclaimer, the term of this patent is extended or adjusted under 35 U.S.C. 154(b) by 276 days.

(21) Appl. No.: 12/664,173

(22) PCT Filed: Jul. 18, 2008

(86) PCT No.: PCT/EP2008/059461
§ 371 (c)(1),
(2), (4) Date: Mar. 10, 2010

(87) PCT Pub. No.: WO2009/013242
PCT Pub. Date: Jan. 29, 2009

(65) Prior Publication Data
US 2010/0173127 A1    Jul. 8, 2010

Related U.S. Application Data

(60) Provisional application No. 60/951,127, filed on Jul. 20, 2007.

(30) Foreign Application Priority Data

Apr. 30, 2008  (WO) .................. PCT/EP2008/055317

(51) Int. Cl.
  *C30B 1/02*   (2006.01)
  *C23C 16/28*  (2006.01)
  (Continued)

(52) U.S. Cl.
  CPC .............. *C23C 16/28* (2013.01); *C23C 14/06* (2013.01); *C23C 14/5806* (2013.01);
  (Continued)

(58) Field of Classification Search
  USPC .................... 117/84, 90, 94, 4, 8, 9
  See application file for complete search history.

(56) References Cited

U.S. PATENT DOCUMENTS 4,633,034 A * 12/1986 Nath et al. .................... 136/256
5,205,871 A   4/1993 Godbey et al.

OTHER PUBLICATIONS

Diez A et al. "Bombardment by reflection—a novel method to prepare high quality hydrogenated amorphous germanium by anodic PCVD" Amorphous and Microcrystalline Silicon Technology—1997, San Francisco, CA Mar. 31-Apr. 4, 1997, Materials Research Society Symposium Proceedings, vol. 467, Mar. 31, 1997, pp. 639-644.

Muniz L R et al. "Aluminium-induced nanocrystalline Ge formation at low temperatures" Journal of Physics: Condensed Matter, IOP Publishing UK, vol. 19, No. 7, Feb. 21, 2007, p. 16.

(Continued)

*Primary Examiner* — Bob M Kunemund
(74) *Attorney, Agent, or Firm* — Knobbe Martens Olson & Bear, LLP

(57) ABSTRACT

The present invention provides a method for providing a crystalline germanium layer on a crystalline base substrate having a crystalline surface. The method comprises cleaning the base substrate for removing contaminants and/or native oxides from the surface, providing an amorphous germanium layer on the surface of the base substrate while exposing to the base substrate to a hydrogen source such as e.g. a hydrogen plasma, a $H_2$ flux or hydrogen originating from dissociation of $GeH_4$ and/or to a non-reactive gas source such as $N_2$, He, Ne, Ar, Kr, Xe, Rn or mixtures thereof, and crystallizing the amorphous germanium layer by annealing the base substrate so as to provide a crystalline germanium layer. The present invention also provides a method for the production of a photovoltaic cell or a photo-electrolysis cell or for forming a CMOS device by using the method according to embodiments of the invention and a substrate comprising a crystalline germanium layer formed by a method according to embodiments of the invention.

22 Claims, 3 Drawing Sheets

(51) Int. Cl.
*C23C 14/06* (2006.01)
*C23C 14/58* (2006.01)
*C23C 16/56* (2006.01)
*C30B 29/08* (2006.01)
*H01L 21/02* (2006.01)

(52) U.S. Cl.
CPC ............ *C23C 16/56* (2013.01); *C30B 1/023* (2013.01); *C30B 29/08* (2013.01); *H01L 21/02381* (2013.01); *H01L 21/02433* (2013.01); *H01L 21/0245* (2013.01); *H01L 21/02532* (2013.01); *H01L 21/02592* (2013.01); *H01L 21/0262* (2013.01); *H01L 21/02667* (2013.01)
USPC ............ 117/4; 117/8; 117/9; 117/94; 117/90; 117/84

(56) References Cited

OTHER PUBLICATIONS

Palmstrøm C J et al. "Solid phase epitaxy of deposited amorphous Ge on GaAs", Appl. Phys. Lett. 47(8), 1985, pp. 815-817.
Sakai Akira et al. "Growth of strain-relaxed Ge films on Si(001) surfaces" Applied Physics Letters, AIP, American Institute of Physics, Melville, NY, vol. 71, No. 24, Dec. 15, 1997, pp. 3510-3515.
Vanamu G et al. "Epitaxial growth of high-quality Ge films on nanostructured silicon substrates" Applied Physics Letters, AIP, American Institute of Physics, Melville, NY, vol. 88, No. 20, May 16, 2006, pp. 204104-1-204-104-3.
Wang S et al. "Thermal stability and band alignments for Ge3N4 dielectrics on Ge" Applied Physics Letters, AIP, American Institute of Physics, Melville, NY, vol. 89, No. 2, Jul. 10, 2006, pp. 22105.
Nayfeh, et al., Appl. Phys. Lett. 85, 2815 (2004).
Reiher, et al., Journal of Crystal Growth 312 (2010) 180-184.
Tersoff, J., Phys. Rev. B 43, 9377 (1991).

\* cited by examiner

METHOD FOR PRODUCING A CRYSTALLINE GERMANIUM LAYER ON A SUBSTRATE

CROSS-REFERENCE TO RELATED APPLICATIONS

This application is the national phase under 35 U.S.C. §371 of PCT International Application No. PCT/EP2008/059461 which has an International filing date of Jul. 18, 2008, which designates the United States of America, and which claims the benefit of U.S. Provisional Application No. 60/951,127 filed Jul. 20, 2007 and PCT International Application No. PCT/EP2008/055317 filed Apr. 30, 2008, the disclosures of which are hereby expressly incorporated by reference in their entireties and are hereby expressly made a portion of this application.

TECHNICAL FIELD OF THE INVENTION

The present invention relates to the field of semiconductor processing, in particular to the production of Ge-based layers on a base substrate, such as a Si substrate. More particularly, the present invention provides a method for providing a crystalline germanium layer on a base substrate, to a method for forming a photovoltaic cell or a photo-electrolysis cell, a method for forming a CMOS device using the method according to embodiments of the invention and to a substrate comprising a crystalline germanium layer formed by a method according to embodiments of the invention.

BACKGROUND OF THE INVENTION

Heteroepitaxy of Ge on Si is a research topic of significant technological importance. Germanium layers integrated into Si-based complementary metal-oxide semiconductor (CMOS) technology offer attractive application possibilities.

The large lattice mismatch between Ge and Si (4%) makes it difficult to obtain high quality crystalline Ge on Si substrates. The lattice mismatch leads to a high surface roughness due to island growth and high densities of threading dislocations in the Ge epilayers. At too high temperatures Ge will mix with Si and SiGe is formed.

In "Solid phase epitaxy of deposited amorphous Ge on GaAs", Appl. Phys. Lett. 47(8), 1985, pp. 815-817, C. J. Palmstrøm et al. describe solid phase epitaxial growth of electron beam deposited amorphous germanium on GaAs. The GaAs substrates are first cleaned to remove contaminants from the surface. Then an amorphous germanium layer is deposited onto the surface. Next, the substrates are annealed to epitaxially crystallise the amorphous germanium layer. Complete epitaxy was obtained for contamination free GaAs surfaces.

Muniz et al (J. of Physics: Condens. Matter 19(7), 076206 (2007)) studied aluminum induced growth of nanocrystalline germanium on glass substrates and on crystalline Si substrates. The influence of aluminum doping and hydrogenation of the Ge layer on the crystallization of the Ge was studied. However, the method described in this article did not lead to Ge layers with a high crystal quality. Alternatives and improved methods are constantly searched for in the industry.

SUMMARY OF THE INVENTION

It is an object of embodiments of the present invention to provide a good method for providing a crystalline germanium layer on a base substrate, a method for forming a photovoltaic cell or a photo-electrolysis cell and a method for forming a CMOS device using the method according to embodiments of the invention and a substrate comprising a crystalline germanium layer formed by a method according to embodiments of the invention.

The above objective is accomplished by a method and device according to embodiments of the present invention.

In a first aspect, the present invention provides a method for providing a crystalline germanium layer on a base substrate having a surface, e.g. a crystalline surface. The method comprises:
cleaning the base substrate for removing contaminants and/or native oxides from the surface,
providing an amorphous germanium layer on the surface of the base substrate, and
crystallising the amorphous germanium layer by annealing the base substrate so as to provide a crystalline germanium layer.

Providing an amorphous germanium layer is performed while exposing the base substrate to a hydrogen source such as e.g. a hydrogen plasma, a $H_2$ flux or hydrogen originating from the dissociation of $GeH_4$, to a non-reactive gas source such as $N_2$, He, Ne, Ar, Kr, Xe, Rn or mixtures thereof, or to a mixture of hydrogen and a non-reactive gas.

According to an embodiment, the present invention provides a method for providing a crystalline germanium layer on a base substrate having a surface, e.g. a crystalline surface. The method comprises:
cleaning the base substrate for removing contaminants and/or native oxides from the surface,
providing an amorphous germanium layer on the surface of the base substrate, and
crystallising the amorphous germanium layer by annealing the base substrate so as to provide a crystalline germanium layer.

According to this embodiment, providing an amorphous germanium layer is performed while exposing the base substrate to a hydrogen source such as e.g. a hydrogen plasma, a $H_2$ flux or hydrogen originating from the dissociation of $GeH_4$.

By exposing the base substrate to a hydrogen source while forming the amorphous germanium layer, the amorphous germanium layer will comprise hydrogen. According to embodiments of the invention, an amount of hydrogen can be present in the amorphous germanium layer of less than 20%. The amount of hydrogen atoms in the layer can for example vary between $4.10^{17}$ H atoms/cm$^3$ and $8.10^{22}$ (=20%) H atoms/cm$^3$ or between $4.10^{17}$ H atoms/cm$^3$ and $4.10^{21}$ H atoms/cm$^3$ or between $4.10^{17}$ H atoms/cm$^3$ and $4.10^{20}$ H atoms/cm$^3$.

By exposing the base substrate to a non-reactive gas source while forming the amorphous germanium layer, the amorphous germanium layer may or may not comprise non-reactive gas atoms. In case when the amorphous germanium layer comprises non-reactive gas atoms, however, the amount of non-reactive gas atoms will be lower than in case the base substrate is expose to a hydrogen source while forming the amorphous germanium layer. The amorphous germanium layer may, for example comprise, less than $4.10^{17}$ non-reactive gas atoms/cm$^3$.

According to another embodiment, the present invention provides a method for providing a crystalline germanium layer on a base substrate having a surface, e.g. a crystalline surface. The method comprises:
cleaning the base substrate for removing contaminants and/or native oxides from the surface, providing an amorphous germanium layer on the surface of the base substrate, and crystallising the amorphous germanium layer by annealing the base substrate so as to provide a crystalline germanium layer.

According to this embodiment, providing an amorphous germanium layer is performed while exposing the base substrate to a non-reactive gas source such as $N_2$, He, Ne, Ar, Kr, Xe, Rn or mixtures thereof.

According to embodiments of the invention, the substrate may be a Si substrate having at least a surface with hexagonal symmetry.

According to other embodiments, at least part of the substrate may have a Si surface with hexagonal symmetry.

The substrate may, for example, be a Si(111) substrate.

According to embodiments of the invention, the crystalline germanium layer may be a monocrystalline germanium layer.

According to embodiments of the invention, cleaning the base substrate may be performed by using HF or HF-gas.

According to embodiments of the invention, cleaning the base substrate may be performed by using a wet or a dry chemical cleaning step.

According to embodiments of the invention, cleaning the base substrate may be performed in a hydrogen plasma.

According to embodiments of the invention, cleaning the base substrate may be performed by thermal annealing of the substrate in vacuum at a temperature above which the native oxide of the substrate is stable. As known by a person skilled in the art, this temperature may be dependent on the kind of substrate used and thus on the kind of native oxide formed.

Cleaning the base substrate may be such that, after cleaning, the substrate surface has a roughness of lower than 1 nm RMS.

According to embodiments of the invention, providing an amorphous germanium layer may, for example, be performed by Chemical Vapour Deposition (CVD), for example plasma enhanced CVD (PECVD), using hydrogen and a gas comprising germanium.

Providing the amorphous germanium layer may be performed at a temperature between −196° C. and 500° C., for example between −100° C. and 400° C., between 100° C. and 400° C. or between 0° C. and 300° C.

According to embodiments of the invention, crystallising the amorphous germanium layer may be performed by annealing the base substrate in a nitrogen atmosphere. The nitrogen atmosphere may, for example, comprise $NH_3$, $N_2$ or a N plasma.

According to embodiments of the invention, annealing may be performed at a temperature of between 400° C. and 900° C. If during annealing the substrate is exposed to a nitrogen atmosphere, a GeN layer may be formed on the Ge layer which can later on be used for, for example, contact improvement or surface passivation or to deposit other materials on top of. According to embodiments of the invention, this GeN may be removed before further performing other process steps.

The method may furthermore comprise providing, e.g. implanting the amorphous germanium layer with dopant elements. According to embodiments of the invention, provision of the dopant elements may be performed during formation of the amorphous germanium layer. According to other embodiments of the invention, provision, e.g. implantation of the dopant elements may be performed after formation of the amorphous germanium layer and before crystallising the amorphous germanium.

In another aspect, the present invention provides a method for providing a crystalline germanium layer on a silicon substrate having at least a surface with hexagonal symmetry, e.g. a crystalline surface with at least hexagonal symmetry. The method comprises:

cleaning the silicon substrate for removing contaminants and/or native oxides from the surface, providing an amorphous germanium layer on the surface of the silicon substrate, and crystallising the amorphous germanium layer by annealing the silicon substrate so as to provide a crystalline germanium layer.

The substrate may, for example, be a Si(111) substrate.

In a further aspect, the present invention provides a method for providing a crystalline germanium layer on a silicon substrate having at least a surface with hexagonal symmetry, e.g. a crystalline surface with at least hexagonal symmetry. The method comprises:

cleaning the silicon substrate for removing contaminants and/or native oxides from the surface, providing an amorphous germanium layer on the surface of the silicon substrate, and crystallising the amorphous germanium layer by annealing the silicon substrate so as to provide a crystalline germanium layer, wherein providing an amorphous germanium layer is performed while exposing the silicon substrate to a hydrogen source such as e.g. a hydrogen plasma, a $H_2$ flux or hydrogen originating from the dissociation of $GeH_4$, to a non-reactive gas source such as $N_2$, He, Ne, Ar, Kr, Xe, Rn or mixtures thereof, or to a mixture of hydrogen and a non-reactive gas.

The substrate may, for example, be a Si(111) substrate.

According to one aspect, the present invention provides a method for providing a crystalline germanium layer on a silicon substrate having at least a surface with hexagonal symmetry, e.g. a crystalline surface with at least hexagonal symmetry. The method comprises:

cleaning the silicon substrate for removing contaminants and/or native oxides from the surface, providing an amorphous germanium layer on the surface of the silicon substrate, and crystallising the amorphous germanium layer by annealing the silicon substrate so as to provide a crystalline germanium layer, wherein providing an amorphous germanium layer is performed while exposing the silicon substrate to a hydrogen source such as e.g. a hydrogen plasma, a $H_2$ flux or hydrogen originating from the dissociation of $GeH_4$.

The substrate may, for example, be a Si(111) substrate.

The silicon substrate is exposed to the hydrogen source during deposition of the amorphous germanium layer. So while forming the amorphous germanium layer, also the already formed amorphous germanium layer is exposed to the hydrogen source.

According to another aspect, the present invention provides a method for providing a crystalline germanium layer on a silicon substrate having at least a surface with hexagonal symmetry, e.g. a crystalline surface with at least hexagonal symmetry.

The method comprises:

cleaning the silicon substrate for removing contaminants and/or native oxides from the surface, providing an amorphous germanium layer on the surface of the silicon substrate, and crystallising the amorphous germanium layer by annealing the silicon substrate so as to provide a crystalline germanium layer, wherein providing an amorphous germanium layer is performed while exposing the silicon substrate to a non-reactive gas source such as $N_2$, He, Ne, Ar, Kr, Xe, Rn or mixtures thereof.

The substrate may, for example, be a Si(111) substrate.

In a further aspect, the present invention also provides a method for forming a photovoltaic cell or a photo-electrolysis cell, the method comprising forming a crystalline germanium layer on a base substrate by a method according to embodiments of the present invention.

According to embodiments of the invention, the crystalline germanium layer may be a monocrystalline germanium layer.

In yet a further aspect, the present invention also provides a method for forming a CMOS device, comprising forming a crystalline germanium layer on a base substrate by a method according to embodiments of the present invention.

According to embodiments of the invention, the crystalline germanium layer may be a monocrystalline germanium layer.

In still a further aspect, the present invention provides a substrate comprising a crystalline germanium layer, wherein the crystalline germanium layer has a thickness of lower than 500 nm and wherein the X-ray diffraction rocking curve (less preferred is omega/2theta) characteristic shows a full width at half maximum (FWHM) of lower than 500 arcsec. The RMS roughness of a surface of the germanium layer is lower than 5 nm, and may, for example, even be lower than 2 nm or lower than 1 nm.

According to embodiments of the invention, the crystalline germanium layer may be a monocrystalline germanium layer.

The invention is related to a method and a device as disclosed in the appended claims. Particular embodiments of the method and device are disclosed in combinations of the independent claims with one or more claims dependent thereon.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DETAILED DESCRIPTION OF THE INVENTION

Figure 1:
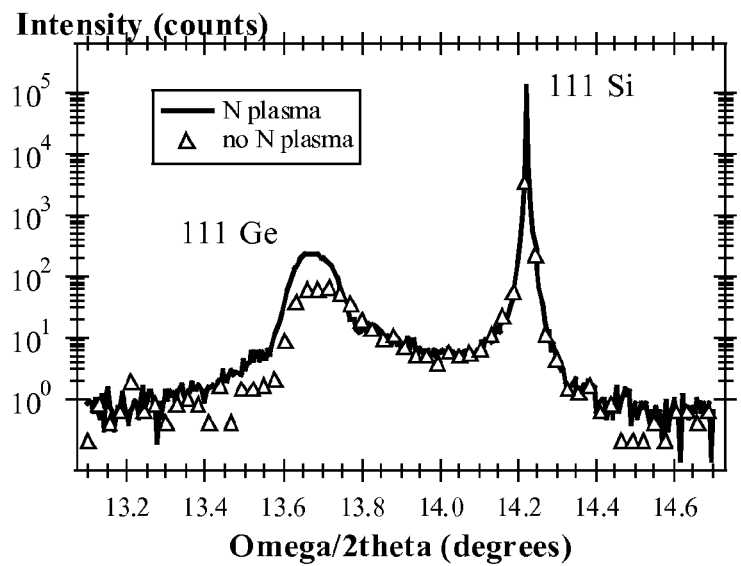
FIG. 1 shows an XRD Omega/2 theta scan of a 50 nm thick crystallised amorphous Ge layer on Si, with (solid line) and without (triangles) the use of a nitrogen plasma during vacuum anneal.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

The invention is related to a method wherein a crystalline germanium (Ge) layer is obtained by formation of an amorphous Ge layer on a base substrate, e.g. a Si(111) substrate, while the substrate is exposed to a hydrogen source or a non-reactive gas source, whereafter the amorphous layer is subjected to an anneal step, during which the amorphous layer crystallises to form a crystalline layer. In the present description and the appended claims, a 'germanium layer' is to be understood as a layer comprising germanium as the main element (e.g. more than 90%), not necessarily as a pure Ge layer. The non-reactive gas source may also be referred to as inert gas source. The gas used during deposition of the amorphous germanium layer should be a gas that lowers the mobility of germanium atoms on the surface of the layer but which furthermore does not inhibit thermal crystallization. Therefore, the non-reactive gas source may also be referred to as inert gas source. In other words, the gas used during deposition of the a-Ge layer may be a diffusion limiting gas. Examples of non-reactive gasses that may be used with embodiments of the present invention are $N_2$, He, Ne, Ar, Kr, Xe, Rn or mixtures thereof. Other gasses such as e.g. $O_2$ are expected to react with the material of the base substrate or with the deposited germanium atoms. This will lead to the coverage of the substrate surface (e.g. in case of Si with $SiO_2$) and/or incorporation of these elements into the amorphous germanium layer. During thermal annealing these incorporated elements, which are larger than hydrogen, will not be able to escape from the germanium layer. The presence of elements different from Ge in the crystalline germanium layer is mostly not wanted because of the resulting reduced crystal quality and reduced electrical quality of the layer although sometimes dopants at a level below 0.1 promille are wanted.

The method for providing a crystalline germanium layer on a base substrate having a surface, e.g. crystalline surface, comprises:
cleaning the base substrate for removing contaminants and/or native oxides from the surface,
providing an amorphous germanium layer on the surface of the base substrate, and
crystallising the amorphous germanium layer by annealing the base substrate so as to provide a crystalline germanium layer,
wherein providing an amorphous germanium layer is performed while exposing the base substrate to a hydrogen source such as e.g. a hydrogen plasma, a $H_2$ flux or hydrogen originating from the dissociation of $GeH_4$, to a non-reactive gas source such as $N_2$, He, Ne, Ar, Kr, Xe, Rn or mixtures thereof, or to a mixture of hydrogen and a non-reactive gas.

The supply and/or presence of a hydrogen source and/or a non-reactive gas during deposition of germanium can influence the crystal quality which can be obtained for crystallization of Ge, e.g. crystallization of amorphous Ge, on the base substrate such as silicon. This is because the supply and/or presence of a hydrogen and/or a non-reactive gas during deposition of germanium lowers the mobility of germanium atoms on the surface of the layer. Hence, the gas used during deposition of the a-Ge layer may be a diffusion limiting gas which furthermore does not inhibit thermal crystallization. In this way, the short range order (that fixes distances between atoms) in the layer is reduced, which leads to a layer with no overall structure, i.e. to a more amorphous or an amorphous layer. This is important because during thermal annealing, one wants crystalline germanium seeds to be formed at the interface with the base substrate, e.g. silicon substrate. The material of the base substrate, e.g. silicon will tend to enforce its crystal orientation on the germanium seeds. These seeds grow towards the surface, and can lead to single crystalline germanium with the same orientation as the base substrate, e.g. silicon substrate. When the deposited germanium layer would not be completely amorphous, it could comprise crystalline seeds with random orientation inside the layer. During subsequent thermal anneal these seed would then grow and cause a polycrystalline germanium layer (grains are not aligned with underlying base substrate, e.g. silicon substrate). Hence, deposition of the amorphous germanium layer in the presence of hydrogen or a non-reactive gas leads to improvement of the quality of the final crystalline layer. Examples: for Si(111) and off cuts monocrystalline Ge can be formed. Monocrystalline Ge can be formed on Si(001) by depositing a completely amorphous Ge layer. An alternative approach is to use laser crystallization to start crystallization at the Si—Ge interface to obtain monocrystalline Ge on Si(001).

Upon exposing the base substrate to the hydrogen source and/or the non-reactive gas source during deposition of the amorphous germanium layer, the already formed amorphous germanium layer is also exposed to the hydrogen source and/or to the non-reactive gas source.

By exposing the base substrate to a hydrogen source while forming the amorphous germanium layer, the amorphous germanium layer will comprise hydrogen. According to embodiments of the invention, an amount of hydrogen can be present in the amorphous germanium layer of less than 20%. The amount of hydrogen included in the Ge layer depends on the deposition method used to form the a-Ge layer and on the amount of hydrogen that is present during deposition. The amount of hydrogen atoms in the layer can for example vary between $4.10^{17}$H atoms/$cm^3$ and $8.10^{22}$H atoms/$cm^3$ or between $4.10^{17}$H atoms/$cm^3$ and $4.10^{21}$H atoms/$cm^3$ or between $4.10^{17}$H atoms/$cm^3$ and $4.10^{20}$H atoms/$cm^3$. By exposing the base substrate to a non-reactive gas source while forming the amorphous germanium layer, the amorphous germanium layer may or may not comprise non-reactive gas atoms. In case when the amorphous germanium layer comprises non-reactive gas atoms, however, the amount of non-reactive gas atoms will be lower than in case the base substrate is expose to a hydrogen source while forming the amorphous germanium layer. The amorphous germanium layer may, for example comprise, less than $4.10^{17}$ non-reactive gas atoms/cm³.

According to embodiments of the invention, the base substrate is cleaned prior to the a-Ge (amorphous Ge) layer formation, to remove oxides from the surface, in particular native oxides. Also during the cleaning step, possible metal contamination and particles are removed. The cleaning step may, according to embodiments of the invention, be a chemical cleaning step. The cleaning step can be a wet or a dry chemical cleaning step. According to other embodiments of the invention, the cleaning step may be a thermal cleaning step performed in vacuum at a temperature above which the native oxide of the substrate is stable. As known by a person skilled in the art, this temperature may be dependent on the kind of substrate used and thus on the kind of native oxide formed. According to still further embodiments of the invention, the cleaning step may be a hydrogen plasma cleaning step.

According to a particular embodiment, the cleaning step may be such that the surface roughness after cleaning is low. For example, for a Ge layer with a thickness lower than 200 nm, the surface roughness may be lower than 1 nm RMS (measured with X-ray). For germanium layers with a thickness of ~500 nm, the RMS surface roughness may be lower than 20 nm, for example lower than 15 nm, lower than 10 nm, lower than 5 nm or lower than 2 nm. For germanium layers with a thickness of ~200 nm the RMS surface roughness may be lower than 15 nm, for example lower than 10 nm, lower than 5 nm, lower than 2 nm or lower than 1 nm. For germanium layers with a thickness of ~60 nm, the RMS surface roughness may be lower than 5 nm, for example lower than 2 nm, lower than 1 nm or lower than 0.8 nm. In an experiment a layer of 130 nm germanium was grown on a Si(111) substrate. In that case an RMS surface roughness of 1.46 nm was measured with AFM (atomic force microscopy) on a surface area of 0.5 µm×0.5 µm.

Possibly, a pre-deposition anneal step may be performed, at a temperature of e.g. 900° C., under vacuum or for example under exposure to $H_2$ or to a hydrogen plasma, to further clean the surface, prior to the deposition of the a-Ge layer.

The cleaning step performed for removing contaminants and/or native oxides from the surface before an a-Ge layer is provided on that substrate causes the subsequently deposited a-Ge layer to be in direct contact with the crystalline surface of the base substrate. Formation of a Ge layer onto the clean substrate would lead to a polycrystalline Ge layer instead of an a-Ge layer because the underlying crystalline surface will force the increase of the short range order of the thin germanium layer. However, by exposing the silicon surface to a gas which lowers the surface mobility of the deposited Ge atoms such as hydrogen and/or a non-reactive gas such as e.g. $N_2$, He, Ne, Ar, Kr, Xe, Rn or mixtures thereof, the short range order will be reduced which results in formation of an a-Ge layer rather than a polycrystalline one.

Formation of the a-Ge layer may be performed by a chemical vapour deposition (CVD) technique such as, for example, by Plasma Enhanced Chemical Vapour Deposition (PECVD) with, for example, $GeH_4$ used as a precursor gas. Alternatively, an evaporation technique can be used to form the a-Ge layer, e.g. Molecular Beam Epitaxy (MBE), using a $H_2$ flux or a hydrogen-plasma. Regardless of the deposition method, the deposition temperature may be between −196° C. and 500° C., for example between −100° C. and 400° C., between 100° C. and 400° C. or between 0° C. and 300° C. According to a particular embodiment, a-Ge may be deposited at a temperature of about 150° C., while annealing to crystallise the a-Ge layer may take place at about 600° C. (see further). According to another example, an a-Ge layer may be formed at a temperature of about 400° C. for one hour or at a temperature of about 450° C. for 1 minute.

According to an embodiment, dopant elements may be provided, e.g. implanted in the a-Ge layer. According to embodiments of the invention, the dopant elements may be included during formation of the a-Ge layer. Dopants may also be included by e.g. (ion) implantation after crystallization of the amorphous germanium layer.

According to other embodiments of the invention, dopant elements may be included by e.g. (ion) implantation after formation of the a-Ge layer and before crystallising the a-Ge layer. Hence, in both cases, the dopants are included in the a-Ge layer prior to annealing (for example ion implantation can be done such as to realise p doping or n doping). The subsequent crystallisation step causes activation of the dopants at lower temperatures compared to an activation anneal of dopants introduced in a crystallised layer by implantation. In such a crystallised layer, defects in the crystal caused by the implantation require annealing at high temperatures to restore the crystal, but this in turn leads to higher diffusion of dopants in Ge. There is another advantage in case of ion implantation in the amorphous germanium layer. As the amorphous Ge layer does not show channeling effects upon implantation (in contrast to crystalline Ge), a sharp and undeep junction can be realised. Therefore the method according to embodiments of the invention allows lowering the thermal budget of the doping step, and to obtain shallow junctions. Possibly, the deposition of Ge and the introduction of dopant elements may take place simultaneously during deposition. Dopants may also be included by e.g. (ion) implantation after crystallization of the amorphous germanium layer.

The crystallisation anneal step may, according to embodiments of the invention, take place under a Nitrogen atmosphere. The nitrogen atmosphere can be a nitrogen-plasma atmosphere or a non-plasma atmosphere comprising for example $N_2$ or $NH_3$.

According to other embodiments of the invention, the crystallisation anneal can also take place under vacuum and without nitrogen.

When annealing is performed in a nitrogen-containing atmosphere, a layer of GeN (for example $Ge_3N_4$) may be formed on the surface of the crystallised Ge layer. Such a GeN layer improves the surface roughness (i.e. lower roughness) of the crystallised Ge layer (underneath the GeN). A GeN layer can limit roughening of the surface during crystallisation of the Ge. Furthermore, the GeN layer can passivate the underlying Ge. The presence of such GeN layer may improve quality of subsequently formed contacts on the crystalline Ge layer. On top of the GeN layer, other layers, for example one or more group III-Nitride layers may be formed, e.g. a GaN layer. Alternatively, the GeN layer may be removed. After removal of the GeN layer, a III-V layer may be applied on top of the Ge layer. When no nitrogen-atmosphere is applied during annealing, a III-V layer may applied on top of the crystalline Ge-layer obtained after annealing.

The invention is equally related to a substrate comprising a crystalline germanium layer, wherein the crystalline germanium layer has a thickness of lower than 500 nm and wherein the X-ray diffraction rocking curve (less preferred is omega/2theta) characteristic shows a full width at half maximum (FWHM) of lower than 500 arcsec and a surface of the crystalline germanium layer has a surface roughness of lower than 5 nm, for example even lower than 2 nm. According to preferred embodiments, the thickness of the crystalline Ge-layer (with FWHM lower than 500 arcsec) may be lower than 400 nm, or lower than 300 nm or lower than 200 nm or lower than 150 nm. According to other embodiments, the FWHM (with the thickness of the layer being lower than 500 nm) may be lower than 400 arcsec, or lower than 250 arcsec. According to embodiments of the invention, the crystalline germanium layer may be a monocrystalline germanium layer. The substrate as described above can be produced by using a method according to embodiments of the invention.

Specific embodiments and/or parameter ranges are described hereafter.

In a particular embodiment, the invention is related to a method for forming a crystalline germanium layer on a base substrate, comprising:
- a. obtaining a base substrate having a surface, e.g. a crystalline surface, and cleaning the base substrate for removing contaminants and/or oxides from the surface;
- b. producing a layer of amorphous germanium on the base substrate; and
- c. applying a temperature anneal to the layer of amorphous germanium, such that said layer of amorphous germanium crystallises into a crystalline layer;

whereby said temperature anneal is performed in an atmosphere comprising nitrogen.

According to another particular embodiment, the invention provides a method for forming a crystalline germanium layer on a base substrate, the method comprising:
- a. obtaining a base substrate having a surface, e.g. crystalline surface, and cleaning the base substrate for removing contaminants and/or oxides from the surface;
- b. providing a layer of amorphous germanium on the base substrate while exposing the base substrate to a hydrogen source such as e.g. a hydrogen plasma, a $H_2$ flux, or hydrogen from dissociation of $GeH_4$ and/or to a non-reactive gas source such as $N_2$, He, Ne, Ar, Kr, Xe, Rn or mixtures thereof; and
- c. applying a temperature anneal to said layer of amorphous germanium such that the layer of amorphous germanium crystallises into a crystalline layer.

According to these embodiments, the temperature anneal may or may not be performed in an atmosphere comprising nitrogen.

Upon exposing the base substrate to the hydrogen source and/or to the non-reactive gas source during deposition of the amorphous germanium layer, the already formed amorphous germanium layer is also exposed to the hydrogen source and/or to the non-reactive gas source.

According to still another particular embodiment, the invention provides a method for forming a crystalline germanium layer on a base substrate, the method comprising:
- a. obtaining a base substrate having a surface, e.g. crystalline surface, and cleaning the base substrate for removing contaminants and/or oxides from the surface;
- b. providing a layer of amorphous germanium on the base substrate while exposing the base substrate to a hydrogen source such as e.g. a hydrogen plasma, a $H_2$ flux, or hydrogen from dissociation of $GeH_4$; and
- c. applying a temperature anneal to said layer of amorphous germanium such that the layer of amorphous germanium crystallises into a crystalline layer.

According to these embodiments, the temperature anneal may or may not be performed in an atmosphere comprising nitrogen.

Upon exposing the base substrate to the hydrogen source during deposition of the amorphous germanium layer, the already formed amorphous germanium layer is also exposed to the hydrogen source.

According to a further particular embodiment, the invention provides a method for forming a crystalline germanium layer on a base substrate, the method comprising:
- a. obtaining a base substrate having a surface, e.g. crystalline surface, and cleaning the base substrate for removing contaminants and/or oxides from the surface;
- d. providing a layer of amorphous germanium on the base substrate while exposing the base substrate to a non-reactive gas source such as $N_2$, He, Ne, Ar, Kr, Xe, Rn or mixtures thereof; and
- e. applying a temperature anneal to said layer of amorphous germanium such that the layer of amorphous germanium crystallises into a crystalline layer.

According to these embodiments, the temperature anneal may or may not be performed in an atmosphere comprising nitrogen.

Upon exposing the base substrate to the non-reactive gas source during deposition of the amorphous germanium layer, the already formed amorphous germanium layer is also exposed to the non-reactive gas source.

According to embodiments of the invention, the base substrate may comprise or consist of any suitable material or combination of materials. In certain embodiments, this base substrate may comprise or consist of a semiconductor substrate such as e.g. a doped or undoped silicon substrate, a gallium arsenide substrate (GaAs), a gallium arsenide phosphide substrate (GaAsP), an indium phosphide substrate (InP) or a silicon germanium (SiGe) on silicon substrate, a germanium substrate, or a silicon substrate. Also group III-nitrides grown on Sapphire or Si, such as e.g. GaN on Sapphire or GaN on Si, with one or more interlayers, such as e.g. MN, may be used as base substrate. The base substrate may also comprise an insulating layer such as for example SiO2 or an Si3N4 layer in addition to a semiconductor substrate portion. The base substrate may comprise or consist of silicon-on-glass, silicon-on sapphire substrates. The base substrate may be any other base on which a layer is formed, for example a glass, plastic or metal layer or substrate. The base substrate can be a composite substrate comprising a combination of materials, for example in the form of a layered structure wherein each layer corresponds to a different material.

The base substrate should be chosen such that it can withstand the process. For example, it should be chosen such that it will not interact or not negatively interfere with the formation or production technique of the layer of amorphous material. It should be chosen such that it can withstand the temperature anneal.

The front surface of the base substrate is defined as the surface on which the layer of amorphous material is produced. The front surface may be the surface of an amorphous layer, but preferably the front surface may be the surface of a crystalline layer.

In advantageous embodiments, the base substrate may comprise a porous front surface. The base substrate can for instance be a silicon substrate on or in which a porous front layer is formed. A porous layer can be formed in the front surface of a silicon substrate by for instance using state of the art techniques as for instance anodization in a HF solution.

The amorphous material comprises Germanium. It can comprise more than 90%, more than 95%, more than 96%, more than 97%, more than 98%, more than 99%, more than 99.9%, more than 99.99% of germanium. It may consist of Germanium. It is believed that small concentrations of other elements may be present and will not substantially affect the process according to embodiments of the present invention. In certain embodiments an amount of less than 10%, or less than 8%, or less than 5%, or less than 3%, or less than 2% or less than 1%, or less than 0.1%, or less than 0.01% of silicon can be present. The resulting crystalline layer is then believed to comprise SiGe. Certain impurities may be present without affecting the process substantially. These may be present for instance in an amount smaller than 0.1% or smaller then 0.01%.

According to embodiments of the invention, the base substrate may at least have a surface with hexagonal or six-fold symmetry. In certain embodiments the base substrate may be a (111) oriented substrate. Also off-cut (111) substrates can be used, i.e. off-oriented (111) or tilted (111) substrates. The off-cut angle may be between 0° and 15°, or between 2° and 10°, between 4° and 8°, or between 4° and 6°, such as for example 2°, 4°, 5°, 6°, 8°.

According to other embodiments a substrate can be used wherein only a part of the surface is Si with a hexagonal symmetry. This can for example be obtained by the deposition of an extra layer on Si (111) with or without off-cut and etching holes in the extra layer such as to expose the Si(111) at certain locations. The substrate can be patterned, for example a Si STI (Shallow Trench Isolation) wafer. This allows to realise crystalline Ge only at the locations where there is Si with a hexagonal symmetry, e.g. Si(111).

In other embodiments the base substrate is a (001) oriented substrate. Also off-cut (001) substrates can be used, i.e. off-oriented (001) or tilted (001) substrates. The off-cut angle may be between 0° and 15°, or between 2° and 10°, between 4° and 8°, or between 4° and 6°, such as for example 2°, 4°, 5°, 6°, 8°.

The base substrate may be a Ge(111), a Ge (001), a Si(111), a Si(001), a GaAs(111) or a GaAs(001) substrate.

It is believed that the orientation of the crystallised layer will be determined at least in part by the orientation of the base substrate. In certain embodiments the crystallised layer will have the same orientation as the underlying base substrate. This will be the case for instance where a Ge(111), a Ge (001), a Si(111), a Si(001), a GaAs(111) or a GaAs(001) substrate is used.

In particular embodiments the mismatch in lattice constant between the base substrate, or in case of a composite substrate, the front surface of the base substrate, and the crystallized layer, may be smaller than 10%, or smaller than 5%, or smaller than 4% or smaller than 3% or smaller than 2% or smaller than 1% or smaller than 0.5%. The lattice constant of the crystallised layer used here is the would-be lattice constant if the layer would have been formed freestanding.

For instance Ge and GaAs have a 0.4% lattice mismatch and provide a good crystal quality of the crystallised layer. Another example is Ge and Si(111), which have a lattice mismatch of about 4%, and which provide comparable quality to a crystallised amorphous Ge layer on GaAs(001). The latter result is rather unexpected.

In particular embodiments the mismatch in Thermal expansion coefficient (TEC) between the base substrate, or in case of a composite substrate, the front surface of the base substrate, and the crystallised layer is smaller than 100% or smaller then 75% or smaller then 60%. The TEC of the crystallised layer used here is the would-be TEC if the layer would have been formed free-standing.

According to particular embodiments of the invention, the substrate may be a Si substrate having at least a surface with hexagonal or six-fold symmetry, e.g. a Si(111). In this case, the present invention provides a method for providing a crystalline germanium layer on a Si substrate having at least a surface with hexagonal or six-fold symmetry, e.g. Si(111) substrate, the method comprising:

a. cleaning the Si substrate having at least a surface with hexagonal or six-fold symmetry, e.g. a crystalline surface with hexagonal or six-fold symmetry, such as e.g. a Si(111) substrate, for removing contaminants and/or native oxides from the surface;

b. providing an amorphous germanium layer on the surface of the Si substrate having at least a surface with hexagonal or six-fold symmetry, e.g. Si(111) substrate; and c. crystallising the amorphous germanium layer by annealing the base substrate so as to provide a crystalline germanium layer.

According to these embodiments, the Si substrate having at least a surface with hexagonal or six-fold symmetry, e.g. Si(111) substrate may or may not be exposed to a hydrogen source (e.g. a plasma, $H_2$ flux, or from dissociation of $GeH_4$) and/or to a non-reactive gas source (e.g. $N_2$, He, Ne, Ar, Kr, Xe, Rn or mixtures thereof) during formation of the amorphous germanium layer.

According to these embodiments, crystallising the amorphous germanium layer by annealing may or may not be performed in an atmosphere comprising nitrogen.

For example, according to embodiments of the invention, substrates with at least a surface comprising Si with a six-fold or hexagonal symmetry can be used, such as Si(111) substrates or off-cut Si(111), i.e. off-oriented Si(111) or tilted Si(111). The off-cut angle may be between 0° and 15°, for example between 2° and 10°, between 4° and 8°, or between 4° and 6°, such as for example 2°, 4°, 4.7°, 6°, 8°. The Si may also be doped with suitable dopants.

According to other embodiments, the substrate may comprise a Si support comprising a top layer of Si with hexagonal symmetry at least at the surface on top of other substrates (for example SiC) can be used. With top layer is meant a layer at that side of the bulk the crystalline Ge layer has to be formed. The top layer of Si may for example be a Si(111) top layer or Off-cut or tilted Si(111) top layer. For example a SiC substrate with a Si top layer, the Si(111) top layer having a hexagonal or six-fold symmetry may be used as a substrate according to embodiments of the invention.

The layer of amorphous material, e.g. amorphous germanium is formed while exposing the base substrate to a hydrogen source and/or to a non-reactive gas source such as $N_2$, He, Ne, Ar, Kr, Xe, Rn or mixtures thereof. Upon exposing the base substrate to the hydrogen source and/or to the non-reactive gas source during deposition of the amorphous germanium layer, the already formed amorphous germanium layer is also exposed to the hydrogen source and/or to the non-reactive gas source. As a result, the resulting amorphous germanium layer may comprise hydrogen and/or non-reactive gas molecules.

In case of exposure of the base substrate to a hydrogen source during formation of the amorphous germanium layer, according to embodiments of the invention, an amount of hydrogen can be present in the amorphous germanium layer of, for example, less than 20%. The amount of hydrogen atoms in the layer can for example vary between $4.10^{17}$H atoms/$cm^3$ and $8.10^{22}$ (=20%) H atoms/$cm^3$ or between $4.10^{17}$H atoms/$cm^3$ and $4.10^{21}$H atoms/$cm^3$ or between $4.10^{17}$H atoms/$cm^3$ and $4.10^{20}$H atoms/$cm^3$. The hydrogen source may, for example, be a hydrogen plasma, a H2 flux or may comprise hydrogen originating from the dissociation of $GeH_4$. The amorphous layer of germanium may comprise H in the form of $H_2$ or as Ge—H bonds. Integration of H can be achieved by using for instance Plasma Enhanced Chemical Vapour Deposition (PECVD) in which $GeH_4$ is used as a precursor gas, PECVD layers can be deposited at for instance about 200° C., about 300° C., about 400° C., but lower and higher temperatures are not excluded. The presence of hydrogen during formation of the a-Ge layer is important to obtain a good structure which may give rise to good crystallisation of the a-Ge layer and thus for good formation of the crystalline Ge layer. The cleaning step performed for removing contaminants and/or native oxides from the surface before an a-Ge layer is providing on that substrate causes the subsequently deposited a-Ge layer to be in direct contact with the crystalline surface of the base substrate. Formation of a Ge layer onto the clean substrate would lead to a polycrystalline Ge layer instead of an a-Ge layer because the underlying crystalline surface will force the increase of the short range order of the thin germanium layer. However, by exposing the silicon surface to a gas which lowers the surface mobility of the deposited Ge atoms such as hydrogen and/or a non-reactive gas such as e.g. $N_2$, He, Ne, Ar, Kr, Xe, Rn or mixtures thereof, the short range order will be reduced which results in formation of an a-Ge layer rather than a polycrystalline one.

The a-Ga layer may be formed by e.g. chemical vapour deposition (CVD), e.g. plasma enhanced CVD (PECVD).

Alternatively, evaporation techniques known to the skilled person can be used to form the layer of amorphous material. Such evaporation techniques comprise for instance Molecular Beam Epitaxy (MBE), wherein Ge is thermally evaporated. A $H_2$ flux towards the front surface of the base substrate may be provided to incorporate hydrogen. A hydrogen plasma source can also be used. This can be performed at a temperature between −196° C. and 500° C., for example between −100° C. and 400° C., between 100° C. and 400° C. or between 0° C. and 300° C., for instance at about 150° C. Too high temperatures, e.g. higher than 650° C. or 550° C., may lead to more polycrystalline deposition. Polycrystalline deposition is not preferred, because it requires much higher temperature to change a polycrystalline structure into a crystalline structure than crystallisation of an amorphous layer.

It should be understood that the presence of H and/or of a non-reactive gas during deposition of amorphous material is preferred because it provides layers of higher quality. Thereby H can be incorporated into the amorphous Ge layer, depending on the deposition method and the deposition conditions used. The non-reactive gas atoms are expected not to incorporate or incorporate in low amounts (less than 4e17 atoms/cm3).

In case of H, the amount of hydrogen included in the Ge layer depends on the deposition method and on the amount of hydrogen that is present during deposition. The amount of hydrogen atoms in the layer can for example vary between $4.10^{17}$H atoms/cm$^3$ and $8.10^{22}$ (20%) H atoms/cm$^3$ or $4.10^{17}$H atoms/cm$^3$ and $4.10^{21}$H atoms/cm$^3$ or between $4.10^{17}$H atoms/cm$^3$ and $4.10^{20}$H atoms/cm$^3$. In certain embodiments the layer of amorphous material is further provided with a dopant material as was described above, such that after crystallisation the layer is p doped or n doped. According to embodiments of the invention, provision, e.g. implantation of the dopant elements may be performed during formation of the layer of amorphous material. According to other embodiments of the invention, provision, e.g. implantation of the dopant elements may be performed after formation of the layer of amorphous material and before crystallising the layer of amorphous material. For non-reactive gases less than 4e17 atoms/cm$^3$ can be expected to be incorporated. By exposing the base substrate to a non-reactive gas source while forming the amorphous germanium layer, the amorphous germanium layer may or may not comprise non-reactive gas atoms. In case when the amorphous germanium layer comprises non-reactive gas atoms, however, the amount of non-reactive gas atoms will be lower than in case the base substrate is expose to a hydrogen source while forming the amorphous germanium layer.

In case of a Si(111) substrate or a substrate having at least a Si(111) surface, cleaning the Si(111) substrate for removing contaminants and/or native oxides from the surface before deposition of a germanium layer, causes the germanium layer to be in direct contact with the crystalline Si(111) surface. Deposition of germanium onto such clean Si(111) substrates at e.g. 150° C. leads to polycrystalline germanium instead of amorphous germanium because the underlying crystalline silicon surface will force the increase of the short range order of the thin germanium layer. Subsequent thermal annealing of a polycrystalline sample will not lead to a single crystalline germanium layer, because more energy is necessary to transform a polycrystalline layer to a single crystalline layer compared to an amorphous layer. By, during formation of the germanium layer, exposing the silicon surface to a gas which lowers the surface mobility of the deposited Ge atoms such as hydrogen and/or a non-reactive gas such as e.g. $N_2$, He, Ne, Ar, Kr, Xe, Rn or mixtures thereof, the short range order will be reduced, resulting in formation of an amorphous Ge layer rather than a polycrystalline one.

According to embodiments of the invention, the provision of a non-reactive gas can, for example, be done at a pressure higher than or equal to 1e-5 torr, e.g. higher than or equal to 1e-4 torr, at an atomic or molecular flux of 0.01 SCCM (cubic centimeter per minute at STP) or more for a 2 inch wafer.

In case of hydrogen, active hydrogen (e.g. from a H plasma source) can also be used to reduce the mobility of the Ge atoms. Active hydrogen will be incorporated in the amorphous germanium layer, but will then be released again during subsequent crystallization.

Hence, amorphous Ge can be deposited on Si(111) or hexagonal Si at, for example, 150° C. by exposing the substrate to a $H_2$ and/or a non-reactive gas such as e.g. $N_2$, He, Ne, Ar, Kr, Xe, Rn or mixtures thereof, during deposition. Subsequent thermal annealing of the amorphous Ge layer will then lead to single crystalline germanium.

For e.g. a Si(001) substrate the surface mobility of Ge needs to be further reduced compared to Si(111). This can be done by, during deposition of the germanium layer, further reducing the deposition temperature, for example by cooling a sample holder on which the substrate is provided with e.g. liquid nitrogen (77K) during deposition. Another possibility is to increase the gas pressure or flux during evaporation, which reduce the surface mobility of the Ge atoms.

The method may furthermore comprise providing, e.g. implanting dopant elements in the amorphous germanium layer. Providing, e.g. implanting dopant elements in the amorphous layer may have advantages over implantation in a crystalline layer. When dopant elements are provided in the crystalline layer, the crystalline layer will suffer from channel effects and will also require an extra annealing step to remove implantation damage. Performing the provision, e.g. implantation of dopant elements before crystallisation allows omitting the activation anneal and limit the thermal budget because the crystallisation anneal requires less high temperature.

The layer of amorphous material may have a thickness within a range defined between a lower value and an upper value. The lower value can be 0.3 nm, 1.5 nm, 5 nm, 10 nm, 50 nm, 100 nm. The upper value can be 100 nm, 200 nm, 300 nm, 400 nm, 500 nm, 1 micron, 1.5 micron, 2 micron. It is believed that layers of amorphous material with a thickness of 2 micron can completely be crystallised.

The temperature anneal used during annealing of the base substrate during crystallising the layer of amorphous material may be such that the base substrate and the crystallised layer are not negatively affected by it. It should thus be not higher than the melting point of Ge in case of an amorphous layer consisting of pure Germanium.

In particular embodiments the Ge surface may be exposed to a nitrogen gas flow during crystallising the amorphous layer of germanium. The nitrogen gas may comprise N-containing molecules. Examples are $N_2$ gas or ammonia ($NH_3$). These molecules are relatively stable. As nitrogen gas molecules (such as $N_2$ or $NH_3$) are relatively stable the nitrogen molecules from the nitrogen gas flow can be split into atomic nitrogen atoms. This can be done in a plasma or by thermally cracking in front of the substrate, for example by using high substrate temperatures, or in a plasma cell. Cracking of $N_2$ may be done in a plasma and cracking of $NH_3$ may be done by thermally cracking in front of the substrate, for example by using high substrate temperatures or a heating filament, or by cracking in a plasma cell. To form atomic nitrogen able to react with the a-Ge to form a GeN either a temperature above 500° C. can be used or a plasma can be used.

In particular embodiments the nitrogen atmosphere may comprise N, $N_2$ or respective ions. It may further comprise forming gases as known to the skilled person.

In alternative embodiments the atmosphere may comprise $NH_3$.

Performing crystallisation of the amorphous germanium layer under nitrogen atmosphere results in an additional GeN layer formed on top of the crystalline layer, even at very low temperatures such as e.g. 0° C. The plasma can for instance be, but is not limited to, a N plasma, $NH_3$ plasma or an N+ Ar plasma. The temperature anneal may be performed above 400° C., or above 480° C. It may be performed below 940° C. or below 800° C. or below 750° C. The pressure can for instance be about $10^{-5}$ mbar. It may be between $10^{-7}$ mbar and $10^{-3}$ mbar or between $10^{-6}$ mbar and $10^{-4}$ mbar. The nitrogen flow may be within the range of 0.1 sccm and 10 sccm, for instance about 1.2 sccm. The RF power may be between 100 W and 1000 W, or between 200 W and 500 W. The duration of the anneal depends at least in part on the temperature of the anneal. At 450° C. it takes for instance 3 minutes (3') to crystallise a 12 nm thick Germanium layer. By using pulsed heating for instance by means of a flash lamp 1 second can suffice. The duration may therefore be between 1 second (1") and 24 hours, for example between 1 minute (1') and 1 hour.

In other embodiments the atmosphere does not comprise a nitrogen plasma, but may comprise $NH_3$. The temperature anneal may be performed at temperatures between 400° C. and 940° C. or between 400° C. and 850° C. or between 550° C. and 850° C. For temperatures larger than about 450° C. an additional GeN layer is formed on top of the crystallised layer, and the formation speed of such GeN layer increases when going to higher anneal temperatures. Below about 450° C. this is less or not the case. The pressure may be between $10^{-3}$ mbar and 2000 mbar or between 50 mbar and 200 mbar. The nitrogen flow may be within the range of 100 sccm to 10000 sccm, or within the range of 3000 sccm to 5000 sccm. The duration of the anneal depends at least in part on the temperature of the anneal. The duration may therefore be between 1 second (1") and 24 hours, for example between 1 minute (1') and 1 hour.

In other embodiments the atmosphere does not comprise a nitrogen plasma but it may comprise $N_2$. The temperature anneal may be performed at temperatures between 400° C. and 940° C. or between 400° C. and 850° C. or between 550° C. and 850° C. For temperatures larger than about 550° C. or larger than about 600° C. an additional GeN layer is formed on top of the crystallised layer. Below about 550° C. this is less or not the case. The pressure may be larger than $10^{-3}$ mbar. The pressure may be between $10^{-3}$ mbar and 100 bar or between 10 mbar and 1000 mbar. The duration of the anneal depends at least in part on the temperature of the anneal. The duration may therefore be between 1 second (1") and 24 hours, for example between 1 minute (1') and 1 hour.

In other embodiments the atmosphere does not comprise a nitrogen plasma or any other nitrogen source as described above, and the temperature anneal to crystallise the amorphous germanium layer may be performed below 550° C. Here the layer is crystallised but no additional layer of GeN is formed on top of the crystalline layer.

The embodiments in which an additional GeN layer is formed show a smaller RMS roughness of the crystallised layer than the embodiments where no such layer is formed. In other words, embodiments where crystallisation of the amorphous germanium layer is performed under nitrogen atmosphere show a smaller RMS roughness of the crystallised layer than the embodiments where crystallisation was not performed under nitrogen atmosphere.

After having formed the crystallised layer as for instance the crystallised Ge layer, in embodiments wherein a GeN layer is also formed, a group III-V material, e.g. a III-Nitride [III-N] layer can be produced as for instance grown on top of that GeN layer. Such III-N layer can, for example, be GaN.

After having formed the crystallised layer as for instance the crystallised Ge layer, in embodiments wherein no GeN layer is also formed, an appropriate III-V material layer, for example III-nitride layer can be produced as for instance grown on top of said Ge layer.

It has been shown that in embodiments wherein the formation of a GeN layer on top of the crystallised layer occurs, i.e. in embodiments where crystallisation of the amorphous germanium layer is performed under nitrogen atmosphere, the surface roughness of the front surface of the crystalline layer formed is typically better (RMS roughness below 1.5 nm) than when such GeN layer has not been formed, or in other words when crystallisation of the amorphous germanium layer is not performed under nitrogen atmosphere (e.g. vacuum anneal without plasma and at a temperature around 750° C. resulted in a RMS roughness of 4.5 nm). It is thus believed that the formation of GeN, and thus crystallisation of the amorphous germanium layer under nitrogen atmosphere, reduces the front surface roughness of the crystallised layer. Growth of crystalline material on top of a smooth surface leads to better crystal quality than on rough surfaces. Also for processing, flat surfaces are preferred over rough surfaces, because processing of flat surfaces is easier.

In certain embodiments, wherein a GeN layer is formed on top of said crystalline layer, i.e. where crystallisation of the amorphous germanium layer is performed under nitrogen atmosphere, an additional GeN removal process can be applied to remove such GeN layer, after which an appropriate additional III-V material can be produced as for instance grown on top of said Ge layer.

The growth of the extra III-V material can for instance but not only be performed by MOCVD (metal-organic chemical vapour deposition). It can be an epitaxial growth.

In certain embodiments wherein an extra GeN layer is formed on top of the crystalline layer during the temperature anneal (or shorter "anneal") a contact structure may be produced on top of this GeN layer.

According to embodiments of the invention, the method may furthermore comprise, after crystallising the amorphous germanium layer and thus after formation of the crystalline germanium layer, thickening the crystalline germanium layer. This may, for example, be done by CSVT (Close Space Vapour Transport).

The present invention also provides a method for forming a photovoltaic cell. The method comprises forming a crystalline germanium layer on a base substrate, the crystalline germanium layer being formed by a method according to embodiments of the invention. Standard solar cell processing techniques known to the skilled person can be applied to achieve this. According to embodiments of the invention, the crystalline germanium layer may be a monocrystalline germanium layer.

The present invention also provides a method for forming a photo-electrolysis cell. The method comprises forming a crystalline germanium layer on a base substrate, the crystalline germanium layer being formed by a method according to embodiments of the invention. According to embodiments of the invention, the crystalline germanium layer may be a monocrystalline germanium layer.

The present invention furthermore provides a method for the production of a CMOS device, comprising forming a crystalline germanium layer on a base substrate, the crystalline germanium layer being formed by a method according to embodiments of the invention. Standard CMOS processing techniques known to the skilled person can be applied to achieve this. According to embodiments of the invention, the crystalline germanium layer may be a monocrystalline germanium layer.

Hereinafter, some examples will be discussed. It has to be understood that these examples are only intended for explanation and illustration purposes and that they are not intended to limit the invention in any way.

EXAMPLES AND TEST RESULTS

Crystallisation of Amorphous Ge, Deposited by PECVD on Si

Example N357

For this example, Si(111) substrates were chemically cleaned to remove metal contamination, particles and native oxides. Hereafter a ~50 nm thick a-Ge (amorphous Ge) was deposited by PECVD on the Si(111) substrates. Then, the substrates were annealed in vacuum at a ~1e-8 torr background pressure and at a temperature of ~750° C.

From the results obtained from these experiments it was found that after deposition, the Ge was amorphous (according to the RHEED (Reflection High Energy Electron Diffraction) measurements). The RHEED results showed streaks during annealing at a temperature of ~450° C.

XRD (X-Ray Diffraction) measurements showed a diffraction peak, originating from crystalline Ge, with a omega/2theta FWHM of 506 arc seconds.

As a conclusion of this experiment it can be said that a-Ge can be formed by PECVD on Si(111) substrates. This a-Ge can be crystallised when annealed at sufficiently high temperature. It was furthermore found that it was possible to crystallise a 50 nm thick a-Ge. PECVD deposited a-Ge becomes crystalline at ~450° C.

Nitrogen Plasma Anneal

Example N362

This experiment was similar to the previous experiment, i.e. example N357, except that now instead of annealing in vacuum, annealing was now performed under N plasma at ~750° C. (~2e-5 torr background pressure).

The Ge peak observed by XRD measurements showed higher intensity than for example N357, indicating better crystal quality in case of the present example. The FWHM (full width at half maximum) was found to be smaller than for example N357: 382 arc seconds (506 arc seconds for example N357), which also indicates better crystal quality in case of the present example. The XRD rocking curve FWHM was 471 arc seconds for the present example and was 665 arc seconds for example N357, which also indicates better crystal quality in case of the present example.

FIG. 1 shows an XRD Omega/2theta scan a 50 nm thick crystallised germanium layer on Si(111) comparing the present example with example N357. The solid line shows the result for the present example while the triangles show the result for example N357.

Fringes are visible in the XRD omega/2theta scan, indicating good interfacial quality between Ge and Si. The XRD omega/2theta Ge peak is, in case of example N357, shifted to the right with respect to the XRD omega/2theta Ge peak for the present example. Apparently the Ge mixes with the Si when no plasma is applied, and SiGe is formed. The surface roughness for the present example is 1.5 nm in case of the present example, instead of 4.5 nm for example N357.

It can be concluded that annealing under nitrogen atmosphere, in the example given N plasma, leads to better crystal quality and to a smoother surfaces than when no nitrogen atmosphere is used, i.e. when annealing is performed in vacuum. SiGe formation is apparently suppressed when annealing under nitrogen atmosphere, in the example given Nitrogen plasma.

Nitrogen Plasma Anneal of a-Ge Layer without Hydrogen

Example N371

Si(111) substrates were chemically cleaned to remove metal contamination, particles and native oxides. Thereafter a ~12 nm thick a-Ge was deposited in a vacuum system. No hydrogen was added.

Annealing was performed in vacuum (~5e-9 torr background pressure), at a temperature of ~750° C.

Example N373

Example N373 is similar as example N371, except that in the present case annealing was done under N plasma (~2e-5 torr background pressure), at ~750° C., instead of under vacuum.

XRD omega/2theta measurements did not show a Ge diffraction peak for the sample which received an anneal without N plasma (example N371). For the present example (example N373) there was a Ge diffraction peak visible. From this it can be concluded that the crystal quality is less good than for a-Ge which contains hydrogen. From the above experiments, it can be concluded that anneal under nitrogen (e.g. N plasma) improves crystallisation of a-Ge. The crystal quality is less good than for a-Ge which contains hydrogen (see further).

NH3 Anneal

Example MOCVDtest005

A Si(111) substrate was chemically cleaned to remove metal contamination, particles and native oxides. Thereafter the substrate was immediately loaded into a vacuum system. The substrate was degassed. A 58 nm thick Ge layer was deposited at ~150° C. by thermal evaporation of a Ge source. During deposition a $H_2$ flux of 0.6 sccm was directed to the substrate, so that hydrogen could be incorporated into the layer. The background pressure was around ~1e-4 torr.

Annealing was performed under $NH_3$ atmosphere (pressure of 100 torr and 6-7 standard liter per minute) at 650° C. for 5 minutes.

XRD omega/2theta measurement showed a Ge diffraction peak. The XRD rocking curve FWHM was 298 arc seconds.

From this example it can be concluded that good crystallisation of a-Ge on Si(111) can be obtained by annealing at 650° C. under $NH_3$ flow.

N2 Atmosphere Anneal

Example N499-A1

A Si(111) substrate was chemically cleaning to remove metal contamination, particles and native oxides. Thereafter the substrate was immediately loaded into a vacuum system. The substrate was degassed. A 58 nm thick Ge layer was deposited at ~150° C. by thermal evaporation of a Ge source. During deposition a $H_2$ flux of 0.6 sccm was directed to the substrate, so that hydrogen could be incorporated into the layer. The background pressure was around ~1e-4 torr.

Annealing was performed under $N_2$ atmosphere, 600° C. for 1 minute.

XRD omega/2theta measurement showed a Ge diffraction peak. The XRD rocking curve FWHM was 287 arc seconds.

The surface roughness from XRR (X-Ray Reflectivity) was found to be 0.8 nm.

From this example it can be concluded that crystallisation of a-Ge on Si can be obtained by annealing at 600° C. under $N_2$ atmosphere.

Different Annealing Times

Example NSG33-ASRTA1

A Si(111) substrate was chemically cleaned to remove metal contamination, particles and native oxides. Thereafter a ~110 nm thick n-doped a-Ge on Si(111) was deposited by PECVD.

Annealing was performed by fast ramp to 600° C., annealing at 600° C. during 1 minute.

Example NSG33-ASRTA2

The present example was similar to NSG33-ASRTA1, except for the annealing. In the present example, annealing was performed by slow ramp to 600° C. in ten minutes, annealing at 600° C. during 1 minute.

A comparison between example NSG33-ASRTA1 and NSG33-ASRTA2 is shown in the table hereunder.

| Name | Ramp | Ge omega/2theta FWHM (arc sec.) | Ge rocking curve FWHM (arc sec.) | Thickness (nm) | Surface roughness (nm) | Interface roughness (nm) |
|---|---|---|---|---|---|---|
| NSG33-ASRTA1 | Fast | 139 | 146 | 111 | 0.7 | 1.2 |
| NSG33-ASRTA2 | Slow | 140 | 161 | 113 | 0.9 | 1.5 |

From the above examples, it can be concluded that annealing can be performed with slow and with fast ramping to the maximum annealing temperature.

A XRD rocking curve FWHM of 146 arc seconds has been obtained, with a surface roughness of 0.7 nm for a 110 nm thick Ge layer.

P-Doping

Example N375

A Si(111) substrate was chemically cleaned to remove metal contamination, particles and native oxides. Thereafter a 91 nm thick a-Ge layer was deposited by PECVD on the Si(111) substrate. $B_2H_6$ was added to the plasma, so that the a-Ge layer formed contained B.

Annealing was performed in vacuum under nitrogen plasma (~2e-5 torr background pressure) at ~650° C.

From Tencor a 913 Ohm/square sheet resistance was measured.

HALL measurements revealed a 857 Ohm/square sheet resistance, p-type doping, 5.4e18 carriers/cm$^3$ and a mobility of 149 cm2/Vs.

It can be concluded that p-type crystalline Ge can be obtained by crystallisation of a-Ge as described above. 5.4 e18 holes/cm$^3$ and a mobility of 149 cm$^2$/Vs was obtained. This example shows that a 91 nm thick a-Ge can be crystallised using a method according to embodiments of the present invention.

N-Doping

Example N391

A Si(111) substrate was chemically cleaned to remove metal contamination, particles and native oxides. Thereafter a 91 nm thick a-Ge layer was deposited by PECVD on the Si(111) substrate. PH$_3$ was added to the plasma, so that the resulting a-Ge layer contained P. Annealing was performed in vacuum under nitrogen plasma (background pressure of ~2e-5 torr) at a temperature of ~750° C.

HALL measurements showed 2373 Ohm/square sheet resistance, n-type doping, 9.2e17 carriers/cm$^3$ and a mobility of 318 cm$^2$/Vs.

This example shows that an n-type crystalline Ge layer can be obtained by crystallisation of a-Ge as described above. A crystalline Ge layer with 9.2 e18 holes/cm$^3$ and a mobility of 318 cm$^2$/Vs can obtained by using a method according to embodiments of the invention.

Influence of Hydrogen

Example N499-A1

A Si(111) substrate was chemically cleaned to remove metal contamination, particles and native oxides. Thereafter the substrate was immediately loaded into a vacuum system. The substrate was degassed. A 58 nm thick Ge was deposited at ~150° C. by thermal evaporation of a Ge source. During deposition a H$_2$ flux of 0.6 sccm was directed to the substrate, so that hydrogen was present during deposition of the amorphous Ge layer. The background pressure was around ~1e-4 torr. Annealing was performed under N$_2$ atmosphere, 600° C. for 1 minute.

Example N501-A1

The present example is similar to example N499-A1, except that in the present example no H$_2$ flow was used during deposition of Ge. The background pressure was around ~1e-9 torr. Annealing was performed under N$_2$ atmosphere, at a temperature of 600° C. for 1 minute.

A good Ge peak was observed for example N499-A1. A small peak was observed for the present example (N501-A1). The XRD rocking curve FWHM for example N499-A1 was found to be 287 arc seconds, while it was found to be 958 arc seconds for the present example (N501-A1).

Figure 2:
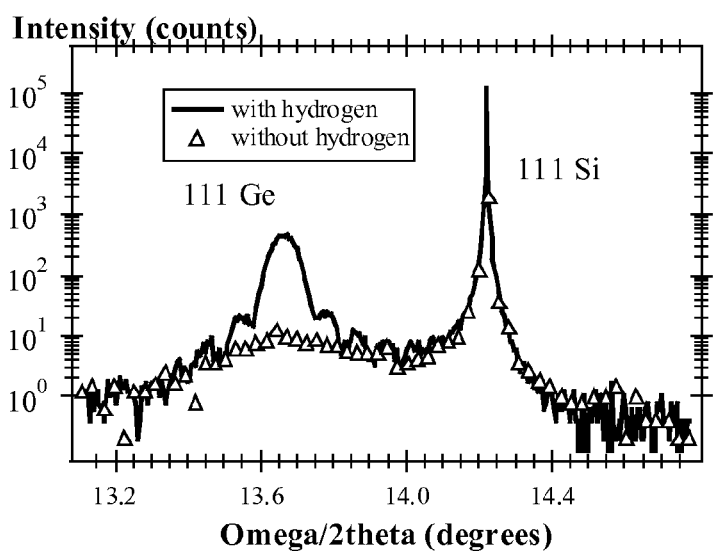
FIG. 2 shows an XRD Omega/2 theta scan of a crystallised amorphous Ge layer on Si(111), with (solid line) and without (triangles) the presence of hydrogen during deposition of the amorphous Ge layer.

FIG. 2 shows an XRD Omega/2theta scan of a crystallised a-Ge layer on Si(111) with (solid line, example N499-A1)) and without (triangles, example N501-A1)) hydrogen being present in the a-Ge layer.

The surface roughness is comparable for both examples and was found to be around 0.8 nm.

From these examples it can be concluded that directing a H$_2$ flux onto a sample while depositing a-Ge leads to incorporation of Hydrogen in the a-Ge layer formed. Amorphous Ge comprising hydrogen significantly improves the results after crystallisation.

Comparison of Two H2 Fluxes

Example N525-A1

A Si(111) substrate was chemically cleaned to remove metal contamination, particles and native oxides. Thereafter the substrate was immediately loaded into a vacuum system. The substrate was degassed. A ~60 nm thick Ge was deposited at ~150° C. by thermal evaporation of a Ge source. Before deposition the substrate was heated to a temperature of ~750° C. during which a 0.6 sccm H$_2$ flux was directed to the substrate. During deposition a H$_2$ flux of 0.6 sccm was directed to the substrate. The background pressure was around ~1e-4 torr. Annealing was performed under N$_2$ atmosphere, 600° C. for 1 minute.

Example N526-A1

The present example is similar to example N525-A1, but with a 0.3 sccm H$_2$ flux (~5e-5 torr background pressure) instead of 0.6 sccm H$_2$ flux (~1e-4 torr background pressure)

XRD and XRR measurements are shown in the table herebelow.

| Name | H2 flux (sccm) | Ge omega/2theta FWHM (arc sec.) | Ge rocking curve FWHM (arc sec.) | Thickness (nm) | Surface roughness (nm) | Interface roughness (nm) |
|---|---|---|---|---|---|---|
| N525-A1 | 0.6 | 243 | 259 | 61 | 0.7 | 0.8 |
| N526-A1 | 0.3 | 239 | 259 | 62 | 0.6 | 0.8 |

From these examples it can be concluded that different H$_2$ fluxes can be used with a method according to embodiments of the present invention. The use of a 0.3 sccm H$_2$ flux appears to lead to a same quality of crystalline layers as the use of a 0.6 sccm H$_2$ flux.

Different Ge Thicknesses

Example N360

A Si(111) substrate was chemically cleaned to remove metal contamination, particles and native oxides. Thereafter a 12 nm thick a-Ge was deposited by PECVD on the Si(111) substrate. Annealing was performed in vacuum under nitrogen plasma (background pressure of ~2e-5 torr) at a temperature of ~750° C.

XRD and RHEED measurements showed crystallisation of the 12 nm thick a-Ge layer. Layers with other thicknesses were also crystallised.

Figure 3:
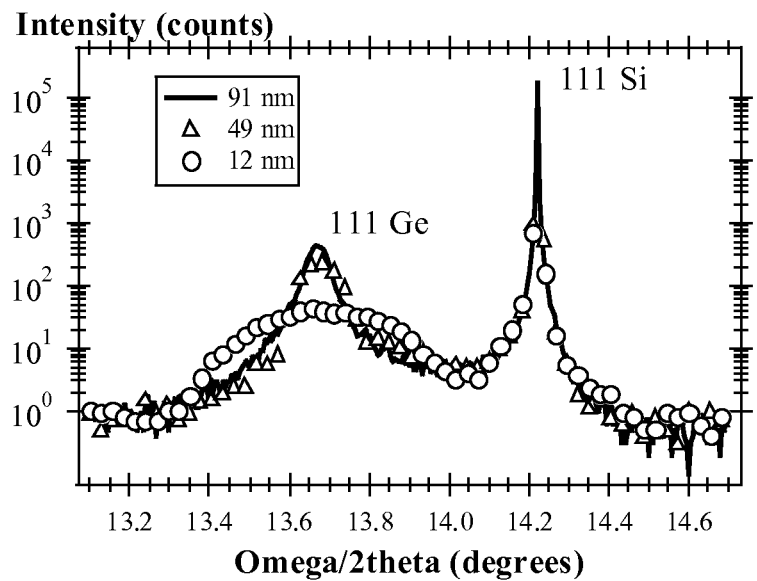
FIG. 3 shows an XRD Omega/2 theta scan of a crystallised amorphous Ge layer on Si(111), with a Ge layer thickness of 91 nm (solid line), 49 nm (triangles) and 12 nm (circles).

FIG. 3 shows an XRD omega/2theta scan for crystallised Ge layer with different thicknesses. Solid line: 91 nm (example N375), triangles: 49 nm (example N362) and circles: 12 nm (example N360).

An other experiment showed crystallisation of 5.5 nm a-Ge on Si(111) substrates.

Annealing was performed in vacuum under nitrogen plasma (background pressure of ~2e-5 torr), and at a temperature of ~750° C.

Example N392

Example N392 was performed under similar conditions as example N391, but the substrate was now held at ~100° C. during deposition, and an a-Ge layer was provided with a thickness of 80 nm.

XRD and XRR measurements for both example N391 and N392 are summarized in the table below.

| Name | Substrate temperature (° C.) | Ge omega/ 2theta FWHM (arc sec.) | Ge rocking curve FWHM (arc sec.) | Thickness (nm) | Surface roughness (nm) | Interface roughness (nm) |
| --- | --- | --- | --- | --- | --- | --- |
| N391 | 200 | 175 | 201 | 88.0 | 0.9 | 2.1 |
| N392 | 100 | 195 | 212 | 80.0 | 0.9 | 2.5 |

It can be concluded that a-Ge layers with different thicknesses can be crystallised using a method according to embodiments of the present invention. There does not seem to exist an upper or lower limit. It has been shown that a-Ge layers with a thickness of 5.5 nm, 12 nm, 49 nm, 60 nm, 91 nm, ~500 nm (see experiment on GaAs) can be crystallised using a method according to embodiments of the present invention.

Influence of N Plasma Power

Example N377

A Si(111) substrate was chemically cleaned to remove metal contamination, particles and native oxides. Thereafter a ~100 nm thick a-Ge layer was deposited by PECVD on the Si(111) substrates. Annealing was performed in vacuum under nitrogen plasma at ~2e-5 torr and at a temperature of ~750° C. The plasma settings used were 1.2 sccm $N_2$ and 180 W RF (Radio Frequency) power.

Example N378

Example N378 was performed under similar conditions as example N377, except that now a 500 W RF power was used instead of 180 W.

From optical microscope measurements it is clear that the surface of the present example (N378) is more flat than that of example N377).

It can be concluded that Increasing the Nitrogen content (e.g. by increasing the RF power for a N plasma source), improves the surface of the resulting crystalline Ge layer.

PECVD Deposition at Different Temperatures

Example N391

A Si(111) substrate was chemically cleaned to remove metal contamination, particles and native oxides. Thereafter a ~88 nm thick a-Ge layer was deposited by PECVD on the Si(111) substrates, at ~200° C. substrate temperature.

From the above it can be concluded that different deposition temperatures can be used for the PECVD deposition for providing an a-Ge layer in a method according to embodiments of the invention.

Ge Deposition Under H2 Flow at Different Temperatures

Example N526-A1

A Si(111) substrate was chemically cleaned to remove metal contamination, particles and native oxides. Thereafter the substrate was immediately loaded into a vacuum system. The substrate was degassed. A 61 nm thick Ge layer was deposited at ~150° C. by thermal evaporation of a Ge source. During deposition a $H_2$ flux of 0.3 sccm was directed to the substrate so that hydrogen was present during deposition of the a-Ge layer. The background pressure was around ~1e-4 torr. Annealing was performed under $N_2$ atmosphere at a temperature of 600° C. for 1 minute.

Example N527-A1

Example N527-A1 was similar to example N526-A1, but now the deposition temperature was 300° C. instead of 150° C.

Example N528-A1

Example N528-A1 was similar to example N526-A1, but now the deposition temperature was 500° C. instead of 150° C.

Example N530-A1

Example N530-A1 was similar to example N526-A1, but now the deposition temperature was 0° C. instead of 150° C.

XRD and XRR measurements for results of the above examples are summarized in the table herebelow.

| Name | Deposition temperature (° C.) | Ge omega/ 2theta FWHM | Ge rocking curve FWHM | Thickness (nm) | Roughness surface (nm) | Roughness interface (nm) |
|---|---|---|---|---|---|---|
| N526-A1 | 150° C. | 239 | 259 | 62.3 | 0.58 | 0.79 |
| N527-A1 | 300° C. | 299 | 342 | 59.8 | 0.32 | 0.5 |
| N528-A1 | 500° C. | 245 | 724 | / | 2.5 | 0.52 |
| N530-A1 | 000° C. | 346 | 331 | 58.6 | 0.64 | 0.98 |

It can be concluded that different deposition temperatures can be used for the Ge deposition under $H_2$ flow with a method according to embodiments of the invention.

$H_2$ Clean

Example N499-A1

A Si(111) substrate was chemically cleaned to remove metal contamination, particles and native oxides. Thereafter the substrate was immediately loaded into a vacuum system. The substrate was degassed. A 58 nm thick Ge layer was deposited at ~150° C. by thermal evaporation of a Ge source. During deposition a $H_2$ flux of 0.6 sccm was directed to the substrate, so that hydrogen could be incorporated into the layer. The background pressure was around ~1e-4 torr Annealing was performed under $N_2$ atmosphere at a temperature of 600° C. for 1 minute.

Example N525-A1

The present example was similar to example N499-A1, but now before deposition the substrate was heated to a temperature of ~750° C. during which a 0.6 sccm $H_2$ flux was directed to the substrate.

XRD and XRR measurements for the above examples are summarized in the table herebelow.

| Name | H2 clean at high temperature | Ge omega/ 2theta FWHM | Ge rocking curve FWHM | Thickness (nm) | Roughness surface (nm) | Roughness interface (nm) |
|---|---|---|---|---|---|---|
| N499-A1 | No | 290 | 287 | 57 | 0.8 | 1.0 |
| N525-A1 | Yes | 243 | 259 | 61 | 0.7 | 0.8 |

It can be concluded that heating the Si substrate in vacuum under an $H_2$ flow can improve the crystal quality of the resulting crystalline Ge layer and can decrease the surface and interface roughness.

Crystallisation on GaAs

Example N402

A GaAs(001) substrate was thermally cleaned to remove native oxides. Thereafter a ~100 nm thick, p-doped, a-Ge layer was deposited by PECVD. Annealing was performed in vacuum under N plasma at a temperature of ~750° C. (~2e-5 torr background pressure)

RHEED measurements showed crystalline Ge after annealing. From XRD measurements a 100 nm Ge peak was difficult to distinguish because of the small lattice mismatch between Ge and GaAs. Fringes were visible in the omega/ 2theta scan, which indicates good interfacial quality. HALL measurements revealed 235 Ohm/square, p-type, 2e19 holes/ $cm^3$, 132 $cm_2$/Vs.

Example N402

A GaAs(001) substrate was thermally cleaned to remove native oxides. Thereafter a ~500 nm thick, p-doped, a-Ge layer was deposited by PECVD. Annealing was performed in vacuum under N plasma at a temperature of ~500° C. (~2e-5 torr background pressure). RHEED experiments showed crystalline Ge after annealing. From XRD measurements a 500 nm Ge peak was distinguished, despite the small lattice mismatch with GaAs. The XRD rocking curve was found to be 129 arc seconds. The surface of the crystalline Ge layer looked quite flat, the measured roughness from XRR measurements was found to be 2.2 nm. HALL measurements revealed 41 Ohm/square, p-type doping, 1.5e19 holes/$cm^3$, 204 $cm^2$/Vs.

It can be concluded that:
- a-Ge can be crystallised on GaAs substrates using a method according to embodiments of the invention, 1.5e19 holes/cm3, 204 cm2/Vs have been obtained,
- ~500 nm a-Ge can be crystallised using a method according to embodiments of the present invention, and
- (001) oriented substrates can be used for Ge crystallisation using a method according to embodiments of the present invention.

Crystallisation on Ge

The crystal quality of crystallised Ge on Ge substrates was difficult to check, therefore GaN was grown on top of crystalline Ge layer. When is found to be GaN is crystalline, it shows that the underlying crystallised Ge layer is of good quality. This has been shown in experiment "GaN growth on crystallised Ge" (see further).

It can be concluded that a-Ge can be crystallised on a Ge substrate using a method according to embodiments of the invention.

Crystallisation on Si(001)

Example NSG49-A

A Si(001) substrate was chemically cleaned to remove metal contamination, particles and native oxides. Thereafter a ~500 nm thick, n-doped, a-Ge layer was deposited by PECVD. Annealing was performed in $N_2$ atmosphere during 5 minutes at a temperature of 600° C.

The XRD omega/2theta scan showed a Ge(004) diffraction peak, indicating the presence of crystalline Ge. The crystal quality is (for the experiments done) lower than for crystallisation on Si(111) (see above).

This example shows that a-Ge can be crystallised on Si(001) using a method according to embodiments of the invention.

GaN Growth on Crystallised Ge

Example N403

A Ge(111) substrate was chemically cleaned to remove metal contamination, particles and native oxides. Thereafter a ~100 nm thick, p-doped, a-Ge layer was deposited by PECVD. Annealing was performed in vacuum under N plasma during 5 minutes at a temperature of ~750° C. A ~100 nm thick GaN was then formed at a temperature of ~700° C.

XRD omega/2theta scan showed a GaN diffraction peak with a FWHM value of 292 arc seconds.

Figure 4:
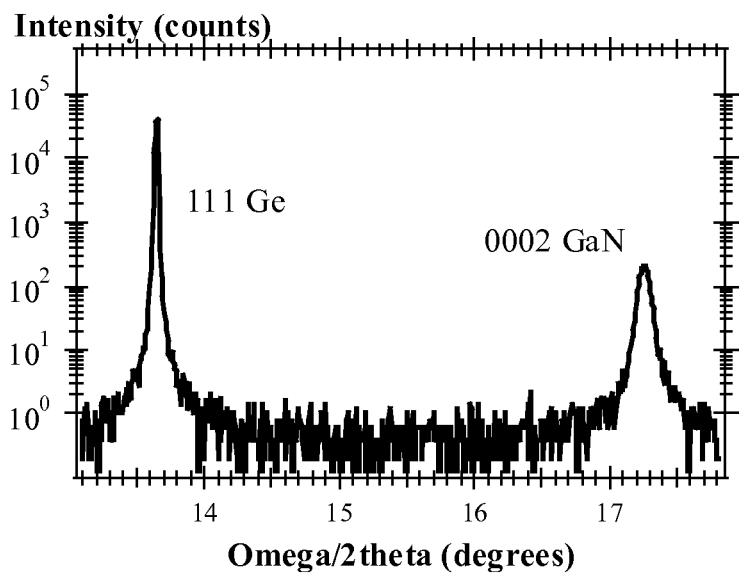
FIG. 4 shows an XRD Omega/2 theta scan of a 100 nm thick GaN layer grown on a 100 nm thick crystallised amorphous Ge layer on Ge(111).

FIG. 4 shows an XRD Omega/2theta scan of a 100 nm thick GaN layer grown on a 100 nm thick crystallised a-Ge layer on Ge (111). A clear GaN diffraction peak is visible.

GaN XRD rocking curve showed a FWHM of 996 arc seconds.

Example N403

A Si(111) (4 degrees off cut) substrate was chemically cleaned to remove metal contamination, particles and native oxides. Thereafter a ~100 nm thick, p-doped, a-Ge layer was deposited by PECVD. Annealing was performed in vacuum under N plasma during 5 minutes at a temperature of ~750° C. Then a ~200 nm thick GaN layer was provided at a temperature of ~550° C.

XRD omega/2theta results showed a GaN diffraction peak with a FWHM value of 295 arc seconds. The crystal quality is lower than for GaN growth on Ge(111) substrates.

Figure 5:
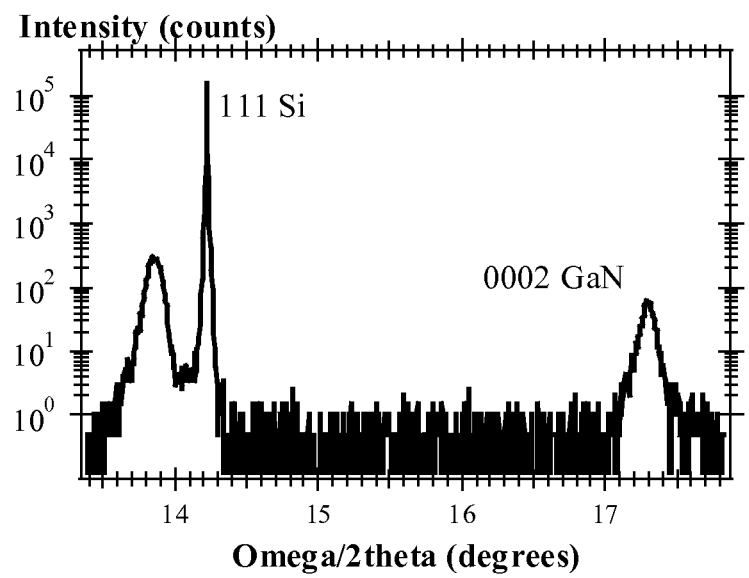
FIG. 5 shows an XRD Omega/2 theta scan of a 200 nm thick GaN grown on a 100 nm thick crystallised amorphous Ge layer on Si(111).

FIG. 5 shows an XRD Omega/2theta scan. A GaN diffraction peak is visible indicating crystalline GaN.

It can be concluded that crystalline GaN can be grown on crystallised Ge on Ge(111) and on crystallised Ge on Si(111) using a method according to embodiments of the invention. The crystal quality is lower than on for GaN growth on Ge(111) substrates.

This shows that a-Ge can be crystallised on a Ge substrate using a method according to embodiments of the invention.

Ge Deposition at Nitrogen Gas Source Exposure

Example N727-A1

A Si(111) substrate was chemically cleaned to remove metal contamination, particles and native oxides. Thereafter the substrate was immediately loaded into a vacuum system. The substrate was degassed. A 58 nm thick Ge layer was then deposited at ~150° C. by thermal evaporation from a Ge source. During deposition a $N_2$ flux of 1.2 sccm was directed to the substrate, so that $N_2$ was present during deposition of the amorphous Ge layer. The background pressure during deposition was around ~2.5e-5 torr. In a next step, annealing was performed under $N_2$ atmosphere at 600° C. for 1 minute. The present example is similar to example N499-A1, except that in the present example instead of a $H_2$ flow an $N_2$ flow was used during deposition of the Ge layer.

Figure 6:
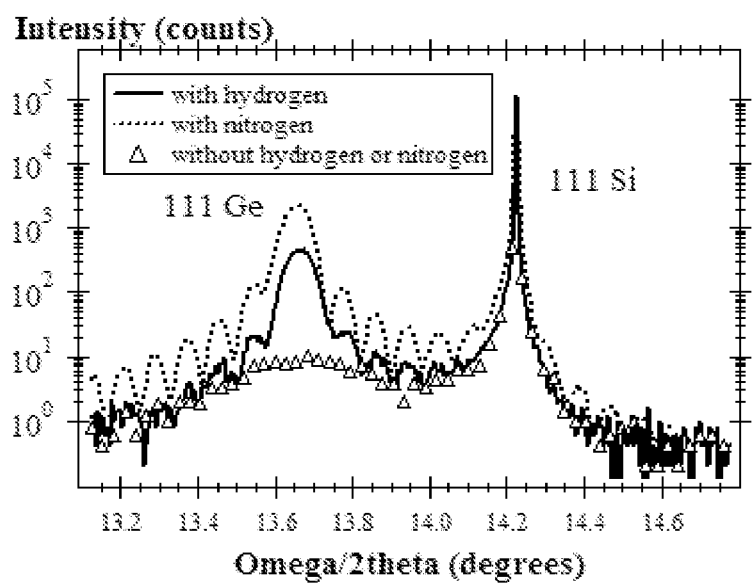
FIG. 6 shows an XRD Omega/2 theta scan of a crystallised amorphous Ge layer on Si(111) in the presence of nitrogen (dotted line), in the presence of hydrogen (solid line) and without the presence of hydrogen or the use of nitrogen (triangles) during deposition of the amorphous Ge layer.

An XRD Omega/2 Theta scan of the present example shows a Ge(111) diffraction peak of high intensity, indicating Ge of high crystal quality is obtained with the same crystal orientation as the Si substrate (see FIG. 6, dotted line). The XRD rocking curve FWHM for the present example was found to be 191 arc seconds, while it was found to be 958 arc seconds for example N501-A1 (no $N_2$ flux during deposition) and 287 arc seconds for example N499-A1 (deposition while exposed to $H_2$ flux), as was described above.

FIG. 6 compares the XRD Omega/2theta scan of the crystallised a-Ge layer on Si(111) in which the amorphous Ge layer was deposited while being exposed to nitrogen (dotted line, present example), with a crystallised a-Ge layer on Si(111) in which the amorphous Ge layer was deposited while being exposed to hydrogen (solid line, example N499-A1 described above) and crystallised a-Ge layer on Si(111) in which the amorphous Ge layer was deposited while not being exposed to any gas (triangles, example N501-A1 described above).

The surface roughness of the Ge layer formed according to the present example was measured by X-ray reflectivity and was found to be 0.4 nm. For examples N499-A1 and N501-A1 the surface roughness was found to be around 0.8 nm. The interface roughness of the Ge layer formed according to the present example was measured by X-ray reflectivity and was found to be 0.4 nm, where for examples N499-A1 and N501-A1 it was found to be around 1.0 nm.

The presence of fringes in the XRD Omega/2 Theta scan confirms that the Ge surface roughness and the roughness at the Si—Ge interface is limited.

From this example it can be concluded that directing a $N_2$ flux onto a sample while depositing an amorphous Ge layer improves the crystal quality, Ge surface roughness and Si—Ge interface roughness after crystallization for the formation of a crystalline Ge layer.

It is to be understood that although preferred embodiments, specific constructions and configurations, as well as materials, have been discussed herein for devices according to the present invention, various changes or modifications in form and detail may be made without departing from the scope of this invention as defined by the appended claims.

The invention claimed is:

1. A method for providing a monocrystalline germanium layer on a base substrate having a crystalline surface, the method comprising:
   cleaning a base substrate, whereby at least one of contaminants or native oxides are removed from a surface of the base substrate;
   providing, by plasma-enhanced chemical vapor deposition using a hydrogen source and a gas comprising germanium, an exposed amorphous germanium layer on the surface of the base substrate; and thereafter;
   annealing the exposed amorphous germanium layer in contact with a nitrogen atmosphere, whereby the exposed amorphous germanium layer is converted into a monocrystalline germanium layer having a GeN layer atop.

2. The method according to claim 1, wherein the base substrate is a Si substrate having at least a surface with hexagonal symmetry.

3. The method according to claim 1, wherein at least part of the substrate has a Si surface with hexagonal symmetry.

4. The method according to claim 3, wherein the substrate is a Si(111) substrate.

5. The method according to claim 1, wherein cleaning the base substrate is performed by using HF or HF-gas.

6. The method according to claim 1, wherein the hydrogen source is at least one of a hydrogen plasma, a $H_2$ flux or hydrogen originating from dissociation of $GeH_4$.

7. The method according to claim 1, wherein, during the step of providing, the base substrate is exposed to a non-reactive gas selected from the group consisting of $N_2$, He, Ne, Ar, Kr, Xe, Rn, and mixtures thereof, wherein the non-reactive gas lowers a mobility of germanium atoms on the surface of the exposed amorphous germanium layer so as to reduce a short range order of germanium but not inhibit thermal crystallization of germanium, and wherein the exposed amorphous germanium layer comprises less than $4.10^{17}$ non-reactive gas atoms/cm$^3$.

8. The method according to claim 1, wherein providing the amorphous germanium layer is performed at a temperature of from −196° C. to 500° C.

9. The method according to claim 1, wherein the nitrogen atmosphere comprises at least one of NH$_3$, N$_2$ or a N plasma.

10. The method according to claim 1, further comprising providing dopant elements in the exposed amorphous germanium layer.

11. The method according to claim 10, wherein providing dopant elements in the exposed amorphous germanium layer is performed during deposition of the amorphous germanium layer or by implantation of dopant elements after formation of the amorphous germanium layer and before annealing the amorphous germanium layer.

12. A method for forming a photovoltaic cell or a photoelectrolysis cell, the method comprising forming a monocrystalline germanium layer on a base substrate by a method according to claim 1.

13. A method for forming a CMOS device, comprising forming a crystalline germanium layer on a base substrate by a method according to claim 1.

14. The method according to claim 6, wherein an amount of hydrogen atoms in the exposed amorphous germanium layer is from $4.10^{17}$ H atoms/cm$^3$ to $8.10^{22}$ H atoms/cm$^3$.

15. The method according to claim 1, wherein the monocrystalline germanium layer has a thickness lower than 200 nm and a surface roughness lower than 1 nm RMS as measured with X-ray.

16. The method according to claim 1, wherein cleaning the base substrate comprises annealing the base substrate at a temperature of 900° C. under vacuum or under exposure to H$_2$ or to a hydrogen plasma to clean the surface, wherein annealing the base substrate is conducted before providing an amorphous germanium layer.

17. The method according to claim 1, wherein the chemical vapor deposition is conducted at a pressure of greater than $1e^{-5}$ torr.

18. The method according to claim 1, wherein the chemical vapor deposition is conducted at a pressure of greater than $1e^{-4}$ torr.

19. The method according to claim 1, wherein the monocrystalline germanium layer has a surface roughness lower than 5 nm as measured with X-ray.

20. The method according to claim 1, further comprising providing atop the GeN layer at least one of a contact improvement layer, a surface passivation layer, or a substrate upon which other materials are deposited.

21. The method according to claim 1, further comprising removing the GeN layer.

22. The method according to claim 1, wherein the hydrogen source and the gas comprising germanium each consist of GeH$_4$.

* * * * *

UNITED STATES PATENT AND TRADEMARK OFFICE
CERTIFICATE OF CORRECTION

PATENT NO. : 8,956,453 B2
APPLICATION NO. : 12/664173
DATED : February 17, 2015
INVENTOR(S) : Ruben Lieten It is certified that error appears in the above-identified patent and that said Letters Patent is hereby corrected as shown below:

Title Page

Page 1 (item 75, Inventors) at line 2, Change "Scherpenheuven" for Stefan Degroote to --Scherpenheuvel--.

Specification

In column 12 at line 32, Change "MN," to --AIN,--.
In column 13 at line 5, Change "then" to --than--.
In column 13 at line 58, Change "then 75%" to --than 75%--.
In column 13 at line 58, Change "then 60%." to --than 60%.--.
In column 15 at line 46, Change "/cm3)." to --/cm$^3$).--.
In column 18 at line 6 (approx.), Change "10^-3" to --10$^{-3}$--.
In column 23 at line 5, Change "cm2/Vs." to --cm$^2$/Vs.--.
In column 24 at line 40, Change "pressure)" to --pressure).--.
In column 25 at line 8 (approx.), Change "An other" to --Another--.
In column 27 at line 60, Change "pressure)" to --pressure).--.
In column 27 at line 67, Change "cm$_2$/Vs." to --cm$^2$/Vs.--.
In column 28 at line 29 (approx.), Change "/cm3," to --/cm$^3$,--.
In column 28 at line 29 (approx.), Change "cm2/Vs" to --cm$^2$/Vs--.
In column 29 at line 62, Change "Omega/2 Theta" to --Omega/2Theta--.
In column 30 at line 22, Change "Omega/2 Theta" to --Omega/2Theta--.

Claims

In column 30 at line 46, In Claim 1, change "thereafter;" to --thereafter--.
In column 31 at line 29, In Claim 14, change "4.10$^{17}$ H" to --4.10$^{17}$H--.
In column 31 at line 29, In Claim 14, change "8.10$^{22}$ H" to --8.10$^{22}$H--.

Signed and Sealed this
Tenth Day of November, 2015

Michelle K. Lee
*Director of the United States Patent and Trademark Office*